(12) United States Patent
Tang et al.

(10) Patent No.: US 10,348,527 B2
(45) Date of Patent: Jul. 9, 2019

(54) TESTING IMPEDANCE ADJUSTMENT

(71) Applicant: MICRON TECHNOLOGY, INC., Boise, ID (US)

(72) Inventors: Qiang Tang, Cupertino, CA (US); Xiaojiang Guo, San Jose, CA (US); Chang Wan Ha, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/904,660

(22) Filed: Feb. 26, 2018

(65) Prior Publication Data

US 2018/0191528 A1    Jul. 5, 2018

Related U.S. Application Data

(63) Continuation of application No. 14/639,293, filed on Mar. 5, 2015, now Pat. No. 9,912,498.

(51) Int. Cl.

| | |
|---|---|
| *G11C 7/00* | (2006.01) |
| *H04L 25/02* | (2006.01) |
| *G06F 13/40* | (2006.01) |
| *G11C 5/04* | (2006.01) |
| *G11C 29/02* | (2006.01) |
| *G11C 29/50* | (2006.01) |

(52) U.S. Cl.
CPC ...... *H04L 25/0278* (2013.01); *G06F 13/4086* (2013.01); *G11C 5/04* (2013.01); *G11C 29/025* (2013.01); *G11C 29/028* (2013.01); *G11C 29/50008* (2013.01)

(58) Field of Classification Search
CPC ... H04L 25/0278; G06F 13/4086; G11C 5/04; G11C 29/025; G11C 29/028
USPC ........................................................ 365/200
See application file for complete search history.

(56) References Cited

U.S. PATENT DOCUMENTS

| | | | |
|---|---|---|---|
| 6,628,223 B2 | 9/2003 | Nagano | |
| 6,862,714 B2 | 3/2005 | Jin et al. | |
| 7,093,145 B2* | 8/2006 | Werner | H04L 25/03006 |
| | | | 713/300 |
| 7,176,729 B2 | 2/2007 | Hayashi et al. | |
| 7,262,643 B2* | 8/2007 | Hayashi | H03K 19/0005 |
| | | | 326/30 |
| 7,323,901 B2* | 1/2008 | Aoyama | H03H 11/30 |
| | | | 326/21 |

(Continued)

*Primary Examiner* — Viet Q Nguyen
(74) *Attorney, Agent, or Firm* — Dicke, Billig & Czaja, PLLC

(57) ABSTRACT

Methods of operating integrated circuit devices include generating a voltage level at a particular node in response to a first voltage level applied to a termination device and a second voltage level applied to a reference resistance; determining whether a plurality of available resistance values of the termination device satisfy a criterion that each available resistance value is either less than a resistance value of the reference resistance, or each available resistance value is greater than the resistance value of the reference resistance; and, when the plurality of available resistance values of the termination device satisfy the criterion, determining whether a voltage level generated at the particular node for a particular available resistance value of the plurality of available resistance values is between a voltage level of a first reference voltage and a voltage level of a second reference voltage.

20 Claims, 6 Drawing Sheets

(56) References Cited

U.S. PATENT DOCUMENTS

| | | | |
|---|---|---|---|
| 7,420,386 B2* | 9/2008 | Wang | G11C 7/1048 326/30 |
| 7,459,930 B2 | 12/2008 | Mei | |
| 7,535,250 B2 | 5/2009 | Batt | |
| 7,557,603 B2 | 7/2009 | Pan | |
| 7,574,634 B2* | 8/2009 | Stave | G11C 29/1201 365/201 |
| 7,595,656 B2* | 9/2009 | Hayami | H03K 19/0005 326/26 |
| 7,626,416 B2 | 12/2009 | Kim | |
| 7,646,215 B2* | 1/2010 | Haig | H03K 19/0005 326/30 |
| 7,696,775 B2* | 4/2010 | Jian | G11C 7/1051 326/30 |
| 7,716,729 B2* | 5/2010 | Bhatia | H04L 63/168 713/151 |
| 7,755,366 B2* | 7/2010 | Hosoe | H03K 19/00384 324/601 |
| 7,906,986 B2* | 3/2011 | Lee | H03K 19/0005 326/26 |
| 7,969,181 B1* | 6/2011 | Fefer | H03K 19/017545 326/30 |
| 7,973,552 B2* | 7/2011 | Chen | H01L 28/20 326/113 |
| 7,982,494 B2 | 7/2011 | Sreeramaneni et al. | |
| 8,253,440 B2* | 8/2012 | Maddux | G11C 29/02 326/30 |
| 8,344,751 B2* | 1/2013 | Cho | H04L 25/0298 326/30 |
| 8,384,423 B2* | 2/2013 | Nguyen | G11C 5/063 326/30 |
| 8,483,986 B2* | 7/2013 | Riho | H04L 25/0278 326/30 |
| 8,553,471 B2 | 10/2013 | Kim et al. | |
| 8,674,720 B2* | 3/2014 | Haraguchi | H03K 19/018585 326/21 |
| 8,710,861 B2* | 4/2014 | Kuroki | H03K 19/017545 326/30 |
| 8,867,595 B1* | 10/2014 | Luo | H03K 3/013 375/224 |
| 8,912,818 B2* | 12/2014 | Bhakta | G11C 7/04 326/26 |
| 9,048,824 B2* | 6/2015 | Chan | H03K 19/0005 |
| 9,543,952 B2* | 1/2017 | Lee | H03K 19/017545 |
| 9,621,160 B2* | 4/2017 | Tang | H03K 19/017545 |
| 9,641,175 B2* | 5/2017 | Fujisawa | G11C 29/02 |
| 9,912,498 B2* | 3/2018 | Tang | G11C 5/04 |
| 2005/0012533 A1 | 1/2005 | Aoyama et al. | |
| 2009/0063789 A1 | 3/2009 | Greeff et al. | |
| 2009/0254925 A1 | 10/2009 | Ayyapureddi et al. | |
| 2010/0244980 A1 | 9/2010 | Olson et al. | |
| 2012/0042148 A1 | 2/2012 | Grunzke | |

* cited by examiner

TESTING IMPEDANCE ADJUSTMENT

RELATED APPLICATIONS

This Application is a Continuation of U.S. patent application Ser. No. 14/639,293, titled "TESTING IMPEDANCE ADJUSTMENT," filed on Mar. 5, 2015 (allowed), which is commonly assigned and incorporated by reference herein in its entirety. U.S. patent application Ser. No. 14/639,293 is further related to U.S. patent application Ser. No. 14/639,375, titled "CIRCUITS FOR IMPEDANCE ADJUSTMENT HAVING MULTIPLE TERMINATION DEVICES WITH SWITCHABLE RESISTANCES AND METHODS OF ADJUSTING IMPEDANCE," filed on Mar. 5, 2015, now U.S. Pat. No. 9,621,160 issued Apr. 11, 2017, which is commonly assigned.

TECHNICAL FIELD

The present disclosure relates generally to integrated circuit devices and, in particular, in one or more embodiments, the present disclosure relates to adjusting impedance in an integrated circuit device, e.g., a memory device.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically uses a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, solid state drives and removable memory modules, and the uses are growing.

Electronic systems, such as memory systems, often include one or more types of memory and that memory is typically coupled to one or more communications buses within the memory system. Time varying signals in such systems are often utilized to transfer information (e.g., data) over one or more conductors often referred to as signal lines. These signal lines are often bundled together to form a communications channel, such as an address bus or a data bus, for example.

To meet the demands for higher performance operating characteristics, designers continue to strive for increasing operating speeds to transfer data across these communications buses within these systems. However, one issue with increased data transfer rates is maintaining signal integrity during these bursts of data on the various bus signal lines of the memory system. As these transfer rates increase, the impedance characteristics of a data bus become more pronounced. Capacitive and inductive characteristics of the signal lines may begin to distort the signal waveforms on the data bus at these higher data rates. Waveforms may begin to spread out and/or reflections may occur at locations of unmatched impedance on the data bus signal lines, for example. Signal integrity (e.g., data integrity) can be affected when an impedance (e.g., output impedance) of one or more nodes of a memory device coupled to a communications bus is not properly matched to the impedance of the communications bus. Impedance mismatch might result from process variations, temperature variations and voltage (e.g., power supply potential) variations in a memory device, for example. Thus, it is typically desirable to reduce these effects in order to reduce the likelihood of data corruption as data is transmitted on a data bus, for example.

Reducing the effects of impedance mismatch often involves the inclusion of adjustable termination devices within signal driver circuits, e.g., output driver circuits. These termination devices, often referred to as pull-up legs and pull-down legs, generally involve switchable resistances between a signal line and a voltage node, i.e., each termination device of a signal driver circuit can selectively connect the signal line to a voltage node through a resistance. For example, pull-up legs generally involve switchable resistances between a signal line and a supply voltage node, e.g., Vcc, while pull-down legs generally involve switchable resistances between the signal line and a reference voltage node, e.g., Vss.

A signal driver circuit may include multiple termination devices, and the resistance of each termination device is often adjustable. For example, the resistance may take the form of multiple resistors selectively connected in parallel between the signal line and the voltage node. By altering which resistors are connected, e.g., through the use of trim settings, the resistance of the termination device can be adjusted.

The resistance of a termination device is often calibrated to match (or closely match) a reference resistance in order to achieve a desired impedance. Because termination devices of a signal driver circuit often use the same configuration of resistors, and because process variation between devices during fabrication would be expected to be minimal within a signal driver circuit, settings determined for one termination device of a signal driver circuit are often copied to other termination devices. However, situations may arise where a desired impedance may not be achieved when adjusted in this manner.

For the reasons stated above, and for other reasons stated below which will become apparent to those skilled in the art upon reading and understanding the present specification, there is a need in the art for alternative apparatus for, and methods for, adjusting impedance in a signal driver circuit.

DETAILED DESCRIPTION

Figure 1:
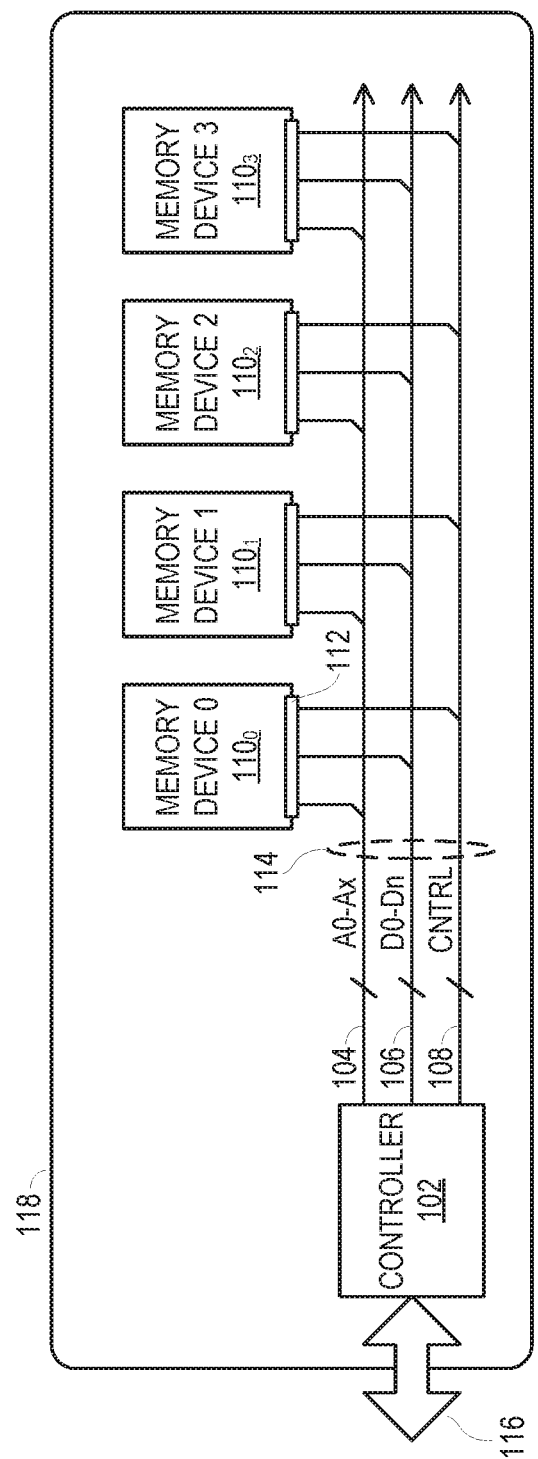
FIG. 1 shows a functional block diagram of an electronic system having at least one integrated circuit device coupled to a communications bus in accordance with an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

FIG. 1 shows a functional block diagram of an electronic system (e.g., memory system) 118 having at least one integrated circuit device, such as memory devices $110_0$-$110_3$, coupled to a communications bus 114 (e.g., system bus) in accordance with an embodiment. Each memory device 110 might include one or more memory die (not shown.) Memory devices 110 comprising multiple die are sometimes referred to as a Multi-Chip Package (MCP), for example. One or more of the memory devices 110 may be in accordance with one or more embodiments herein.

A controller 102, such as a processor or other type of controlling circuitry might be coupled to the communications bus 114. Controller 102 regulates various operations within the memory system 118 as well as providing interactivity with another device or system coupled to the interface 116, for example.

The communications bus 114 might include one or more communications channels, such as an address bus A0-Ax 104, data bus D0-Dn 106 and a control signal bus CNTRL 108. Each of the address bus, data bus and control signal bus might include one or more signal lines. Individual control signals of control signal bus 108 are not shown to improve readability of the figure. Control signal bus 108 might carry control signals such as Address Latch Enable (ALE), Command Latch Enable (CLE), data strobe (DQS) and a clock signal (CLK), for example. Some communications buses utilize the same signal lines to transfer different types of information. For example, the address bus and data bus might transfer their respective signals on the same signal lines of the communications bus. The memory devices 110, communications bus 114 and controller 102 may collectively define an memory system 118 and might be configured (e.g., physically arranged and mounted) on a printed circuit board (PCB), for example.

A memory device 110 might be coupled to the communications bus 114 by an interface 112 (e.g., memory interface). Each memory interface 112 might include one or more nodes for coupling signal lines within (e.g., internal to) the memory device to respective signal lines of the communications bus. The nodes comprising a memory interface 112 might include input nodes and/or output nodes (e.g., I/O nodes), for example. Additional nodes of each memory interface 112 might include nodes to be coupled to one or more power supplies (not shown in FIG. 1), such as power and reference potentials, for example. A memory interface 112 might include an electromechanical type connection or might include soldered lead connections to the communications bus 114 of the memory system 118.

One method used to improve signal integrity, such as in high data rate applications, is to use what is referred to as On-Die Termination (ODT). ODT may be utilized by configuring each of the nodes of a memory interface 112 (e.g., data outputs) of a particular memory device 110 (e.g., die or package) coupled to the communications bus 114 to act (e.g., function) as a terminator (e.g., termination die) for one or more of the nodes of memory interface 112 coupled to the communications bus. For example, for a particular die to act as a termination die (e.g., a terminating memory device), driver circuitry including pull-up and pull-down termination devices configured as a voltage divider might be coupled to each output node of a memory device acting as a termination die. Thus, the output nodes of the termination die might be configured to act as terminators for the bus to which they are coupled.

Figure 2:
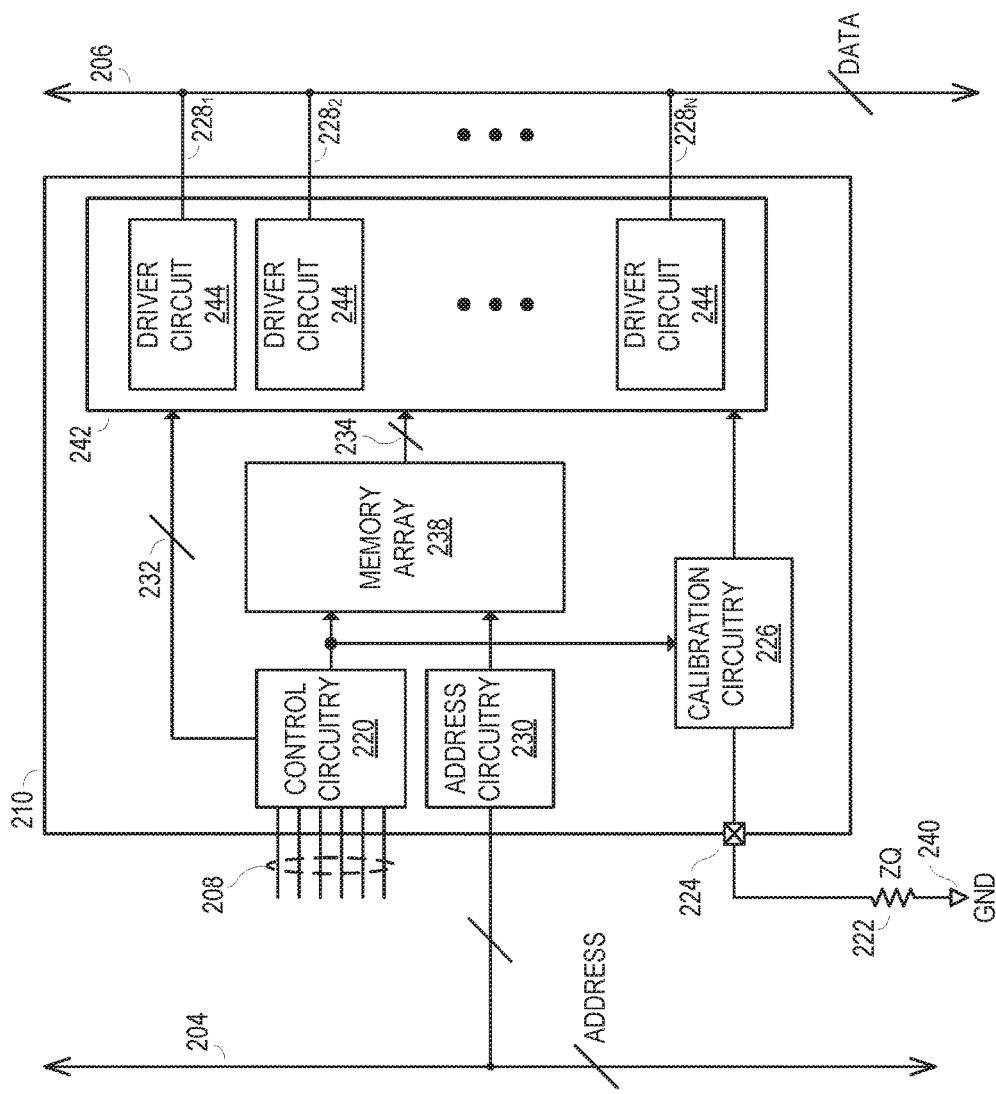
FIG. 2 shows a functional block diagram of a memory as could be used in an electronic system of the type shown in FIG. 1 according to an embodiment.

FIG. 2 shows a functional block diagram of a memory 210 as could be used in an electronic system (e.g., memory system) 118 of the type shown in FIG. 1 according to an embodiment. FIG. 2 illustrates the memory 210, such as one of the memory devices 110 shown in FIG. 1, coupled to an address bus 204, data bus 206 and control signal bus 208. The address bus 204, data bus 206 and control signal bus 208 might be combined, at least in part, to define a communications bus such as described above with respect to FIG. 1, for example. Control signal bus 208 shown coupled to memory 210 might include both memory device specific control signals and control signals commonly coupled to multiple memory devices. Memory 210 may be in accordance with one or more embodiments herein.

Memory 210 includes address circuitry 230 which is coupled the address bus 204 in order to receive addressing information from a controller (e.g., external controller) in order to access the memory array 238 of the memory 210. Memory 210 further includes control circuitry 220 which is coupled to control signal bus 208 and is configured to manage operations within the memory 210, such as verify, read, write and erase operations to be performed on the memory array 238, for example. Control circuitry 220 is also configured to manage operations within the driver (e.g., output driver) circuitry 242 by communicating various control signals over one or more signal lines 232. These operations might include placing the individual signal driver circuits (e.g., output driver circuits) 244, and thus the output nodes $228_1$-$228_N$, in a driving mode or termination mode, for example. The signal driver circuits 244 of the driver circuitry 242 might be placed in a driving mode when the memory 210 is selected to drive the data bus 206 to a particular state, such as in response to performing a read operation in the memory 210, for example. The memory array 238 might communicate data to the signal driver circuits 244 by one or more signal lines 234, for example.

Memory 210 might also be placed in a termination mode. In termination mode, the individual signal driver circuits 244 couple (e.g., switch in) a number of pull-up and/or pull-down termination devices (not shown in FIG. 2) to one or more (e.g., all) of the output nodes $228_1$-$228_N$ of the memory 210. These termination devices are switched in and out responsive to one or more control signals provided by control circuitry 220 across control signal lines 232, providing varying levels of termination strength (e.g., impedance).

A calibration operation, sometimes referred to as ZQ calibration, might be performed on a memory 210 so as to adjust resistance values of the pull-up and/or pull-down termination devices of the signal driver circuits 244 to adjust the impedance (e.g., output impedance) of the output nodes 228, for example. Calibration operations might be facilitated by reference to a reference resistance 222 (e.g., sometimes referred to as a ZQ resistor) coupled to a node (e.g., external terminal) 224 of the memory 210. ZQ resistor 222 might be further coupled to a voltage node 240 to receive a reference voltage, such as Vss or a ground potential. The ZQ resistor 222 and voltage node 240 may be external to the memory 210, e.g., connected during testing of the memory 210 following fabrication.

Calibration circuitry 226 of the memory 210 might be configured to facilitate performing output driver calibration operations, and selectively activating termination devices or switchable resistances of termination devices, in the memory 210 in accordance with various embodiments. Control circuitry 220 might be configured to provide one or more control signals to the calibration circuitry 226, such as to initiate calibrations operations and/or to indicate which termination devices should be activated. Alternatively, the calibration circuitry 226 may be a function of the control circuitry 220. The calibration circuitry 226 may be coupled to a particular signal driver circuit 244 which might be representative of the remaining signal driver circuits 244 of the driver circuitry 242. Control circuitry 220 and/or calibration circuitry 226 can independently or together (or in combination with other circuitry, firmware, and/or software) be considered a controller (e.g., internal controller) of the memory 210.

It will be appreciated by those skilled in the art that additional circuitry and signals can be provided, and that the memory 210 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2.

Figure 3:
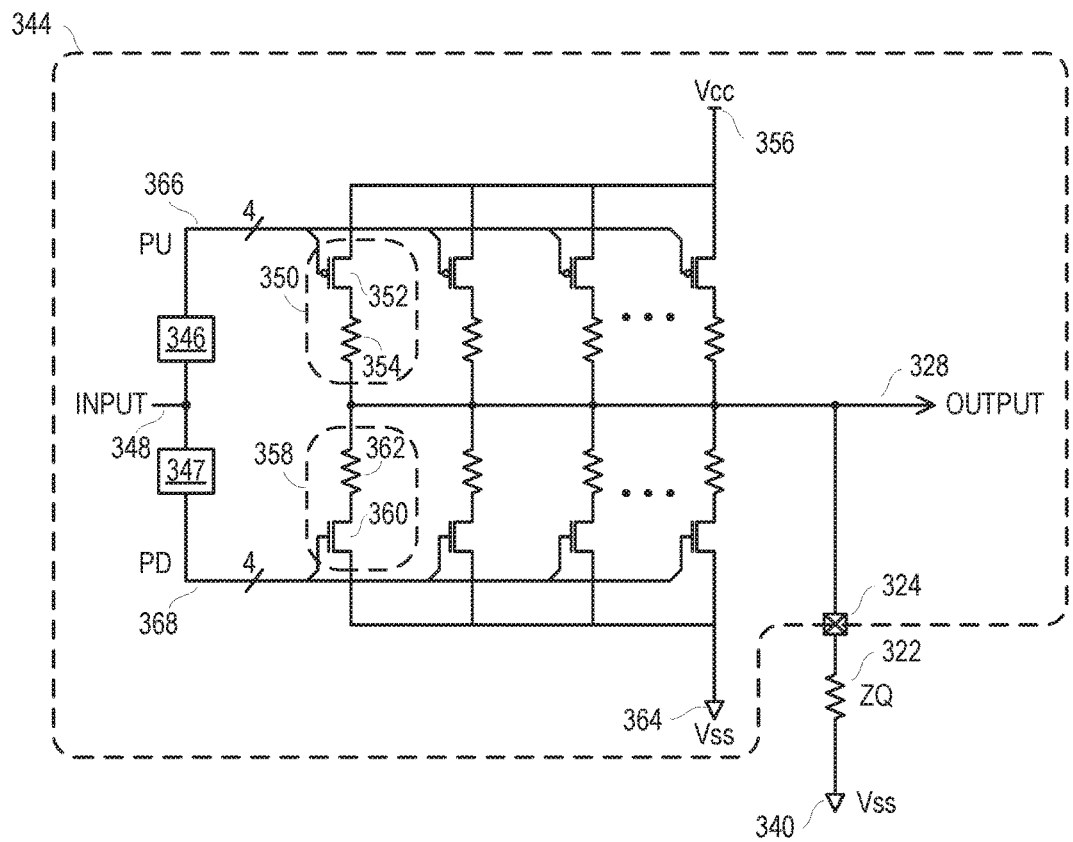
FIG. 3 illustrates a schematic representation of a signal driver circuit according to an embodiment.

FIG. 3 illustrates a schematic representation of a signal driver circuit 344 according to an embodiment. The signal driver circuit 344 may represent a signal driver circuit 244 shown in FIG. 2. Signal driver circuit (e.g., output driver circuit) 344 includes logic 346 and logic 347 which are configured to drive the output node (e.g., output signal line) 328 responsive, at least in part, to a logic level of data received at an input 348 from the memory array, such as in response to a read operation, over a particular signal line of the signal lines 234 coupling the memory array to the driver circuitry, or to present a particular impedance (e.g., calibrated or high Z) at the output node 328. The output node 328 might be one of the plurality of output nodes 228 coupled to the data bus 206 shown in FIG. 2, for example.

Signal driver circuit 344 also includes a plurality of termination devices (e.g., pull-up termination devices 350), each containing a switchable resistance, such as a switch (e.g., a transistor) 352 and a resistance (e.g., a resistor) 354 shown coupled between the output node 328 and a voltage node 356. The voltage node 356 might be coupled to receive a positive voltage, such as a supply potential Vcc. However, the voltage node 356 might be coupled to receive other voltage sources. The control gates of each transistor 352 of the pull-up termination devices 350 may be coupled by signal lines 366 to receive control signals generated by the control circuitry 220 and/or the calibration circuitry 226, for example. Signal lines 366 of the example of FIG. 3 might include four discrete signal lines, one signal line coupled to a control gate of each of the four transistors 352, e.g., in a one-to-one relationship. Signal lines 366 are shown as a single bus to improve readability of the figure. In addition, while pull-up termination devices 350 of FIG. 3 are depicted to include a single transistor 352 and a single resistor 354, pull-up termination devices 350 may include additional transistors and resistors to permit additional adjustment of the resistance presented by any individual pull-up termination device 350. An example of such a configuration will be discussed with reference to FIG. 4A.

Signal driver circuit 344 also includes another plurality of termination devices (e.g., pull-down termination devices 358), each containing a switchable resistance, such as a switch (e.g., a transistor) 360 and a resistance (e.g., a resistor) 362 shown coupled between the output node 328 and a voltage node 364. The voltage node 364 might be coupled to receive a reference potential, such as a ground potential Vss. In general, however, the voltage node 356 is coupled to receive a voltage level that is higher than the voltage level the voltage node 364 is coupled to receive. Similar to the transistors 352 of the pull-up termination devices 350, the control gates of each transistor 360 of the pull-down termination devices 358 may be coupled by signal lines 368 to receive control signals generated by the control circuitry 220 and/or the calibration circuitry 226, for example. Signal lines 368 of the example of FIG. 3 might include four discrete signal lines, one signal line coupled to a control gate of each of the four transistors 360, e.g., in a one-to-one relationship. Signal lines 368 are also shown as a single bus to improve readability of the figure. In addition, while pull-down termination devices 358 of FIG. 3 are depicted to include a single transistor 360 and a single resistor 362, pull-down termination devices 358 may include additional transistors and resistors to permit adjustment of the resistance presented by any individual pull-down termination device 358. An example of such a configuration will be discussed with reference to FIG. 4B. Groups of termination devices, such as the plurality of pull-up termination devices 350 or the plurality of pull-down termination devices 358, are sometimes referred to as unit drivers. Pull-up unit drivers might include different numbers of termination devices than pull-down unit drivers.

The configuration of signal driver circuit 344 shown in FIG. 3 allows for the control circuitry 220 and/or calibration circuitry 226 to selectively activate various combinations of the pull-up termination devices 350 and/or pull-down termination devices 358 of a signal driver circuit 344, such as while the memory device is providing data output on output node 328, while the memory device is presenting high Z on output node 328 (e.g., during data input to the memory device if the output node 328 is physically shared with an input node), while the memory device is acting as a termination device, or while the memory device is performing a calibration operation. As an example, when the input 348 is at a logic high level, logic 346 and 347 might be configured to apply logic low signals to all signal lines 366 and all signal lines 368, thus providing a logic high level at the output node 328. Similarly, when the input 348 is at a logic low level, logic 346 and 347 might be configured to apply logic high signals to all signal lines 366 and all signal lines 368, thus providing a logic low level at the output node 328. When the memory device seeks to provide a high Z at the output node 328, logic 346 might be configured to apply logic high signals to all signal lines 366 and to apply logic low signals to all signal lines 368. And when the memory device seeks to act as a termination device, logic 346 and 347 might be configured to selectively activate their respective pull-up and pull-down termination devices 350 and 358 according to settings (e.g., calibration settings) determined in response to a ZQ calibration.

Each pull-up termination device 350 and/or each pull-down termination device 358 might be configured to exhibit a same termination resistance when activated. Signal driver circuit 344 might have different numbers of pull-up termination devices 350 and/or pull-down termination devices 358 than are pictured in FIG. 3 and might, for example, include many more termination devices 350/358 than those shown in FIG. 3.

The control circuitry 220 and/or calibration circuitry 226 might also selectively adjust the termination devices (e.g., activate one or more pull-up termination devices 350 and/or pull-down termination devices 358) in the signal driver circuit 344 in response to configuration information, e.g., a stored termination value associated with a particular driver circuit.

FIG. 3 further illustrates a reference resistance (e.g., ZQ resistor) 322, such as reference resistance (e.g., ZQ resistor) 222 shown in FIG. 2, coupled between a voltage node 340 and the output node 328. The voltage node 340 might be coupled to receive the same reference potential as voltage node 364.

Figure 4A:
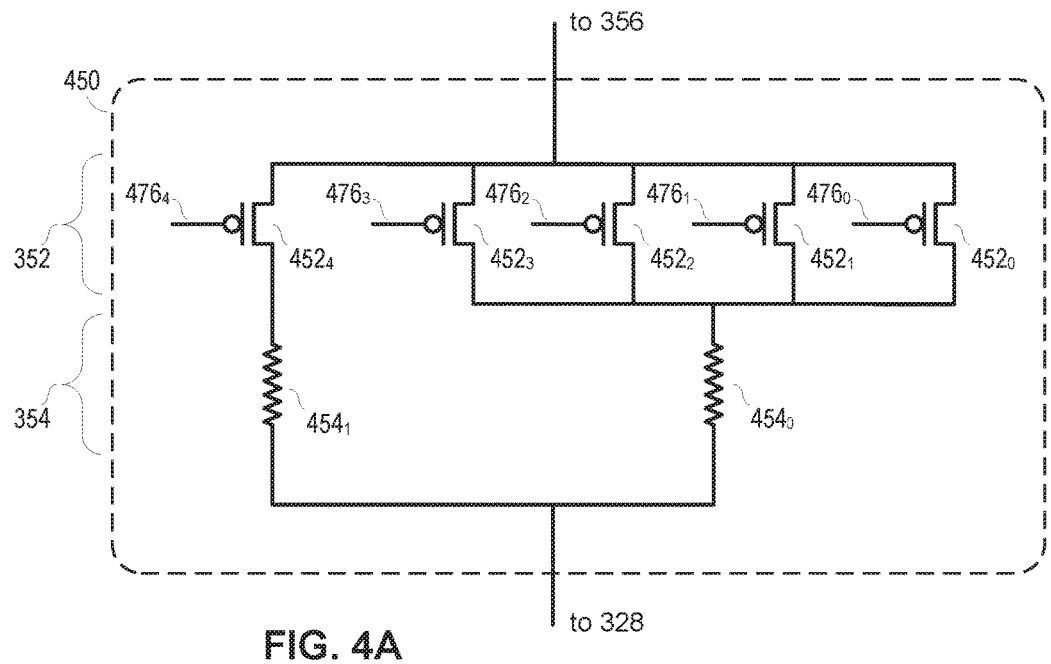
FIGS. 4A-4B are schematics of termination devices according to embodiments.

To provide additional degrees of freedom in adjusting the resistance of a unit driver, individual termination devices may include a configuration of more than one switchable resistance. FIG. 4A is a schematic of a pull-up termination device 450, such as an alternate configuration of switchable resistances of a pull-up termination device 350 of FIG. 3. The pull-up termination device 450 is depicted to include a plurality of switches (e.g., transistors) 452 (e.g., pFET transistors $452_0$-$452_4$) and a plurality of resistances (e.g., resistors) 454 (e.g., resistors $454_0$-$454_1$). The control gates of each transistor 452 of the pull-up termination device 450 may be coupled to individual signal lines 476 (e.g., signal lines $476_0$-$476_4$), which may form a portion of signal lines 366, to receive control signals to selectively activate the transistors 452 independent of each other. Where each pull-up termination device 350 of FIG. 3 has the configuration of the pull-up termination device 450, signal lines 366 of the example of FIG. 3 might include twenty discrete signal lines, one signal line 476 coupled to a control gate of each of the five transistors 452 and for each of the four pull-up termination devices 350, e.g., in a one-to-one relationship. Although each pull-up termination device 350 might be connected to its own set of signal lines of signal lines 366 to allow selective activation (i.e., activation of one or more of its transistors 352/452) or deactivation (i.e., deactivation of all of its transistors 352/452), each activated pull-up termination device 350 might receive the same set of control signals on its corresponding set of signal lines (e.g., signal lines 476).

The transistors 452 may have different channel widths with substantially the same channel length, thus providing different resistance values for the transistors 452. As an example, the transistor $452_1$ may have a channel width of two times the channel width of transistor $452_0$, the transistor $452_2$ may have a channel width of four times the channel width of transistor $452_0$, the transistor $452_3$ may have a channel width of eight times the channel width of transistor $452_0$, and the transistor $452_4$ may have a channel width of eight times the channel width of transistor $452_0$. Typical resistance values of resistors $454_0$ and $454_1$ might be 140 Ohms and 260 Ohms, respectively. In such a configuration, a variety of resistance values can be generated for the pull-up termination device 450 by selectively activating various combinations of the transistors 452. Note that the configuration of switchable resistances depicted in FIG. 4A is just one example, and other configurations of switchable resistances can be used for a pull-up termination device used with embodiments described herein, which are not restricted to any particular configuration.

Figure 4B:
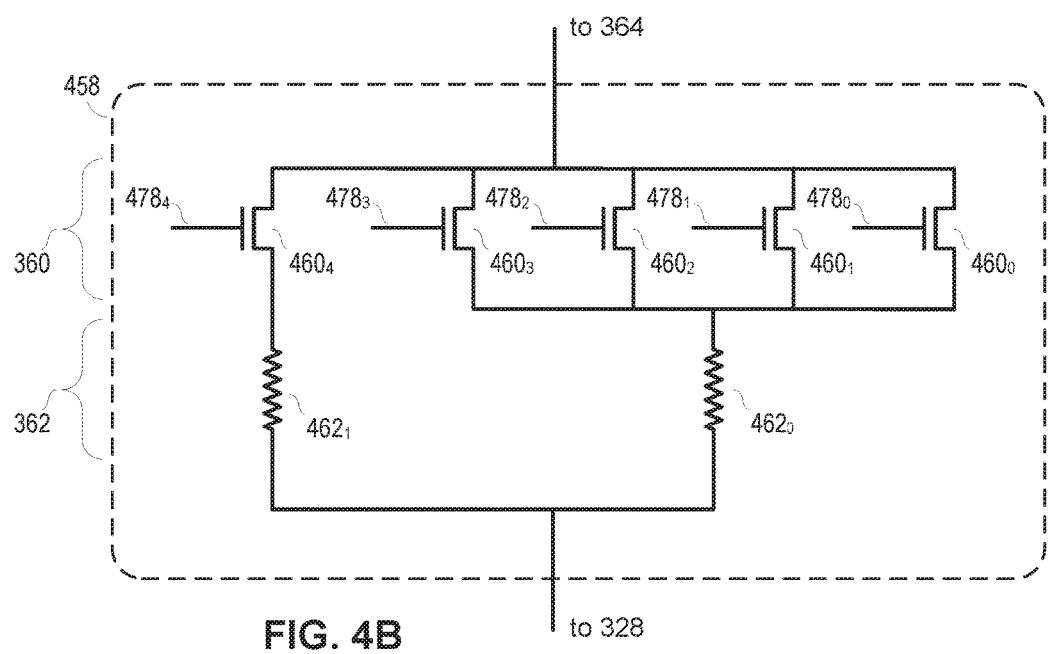

FIG. 4B is a schematic of a pull-down termination device 458, such as an alternate configuration of switchable resistances of a pull-down termination device 358 of FIG. 3. The configuration of the pull-down termination device 458 may mirror the configuration of the pull-up termination device 450. As such, the pull-down termination device 458 is depicted to include a plurality of switches (e.g., transistors) 460 (e.g., nFET transistors $460_0$-$460_4$) and a plurality of resistances (e.g., resistors) 462 (e.g., resistors $462_0$-$462_1$). The control gates of each transistor 460 of the pull-down termination device 458 may be coupled to individual signal lines 478 (e.g., signal lines $478_0$-$478_4$), which may form a portion of signal lines 368, to receive control signals to selectively activate the transistors 460 independent of each other. Where each pull-down termination device 358 of FIG. 3 has the configuration of the pull-down termination device 458, signal lines 368 of the example of FIG. 3 might include twenty discrete signal lines, one signal line 478 coupled to a control gate of each of the five transistors 460 and for each of the four pull-down termination devices 358, e.g., in a one-to-one relationship. Although each pull-down termination device 358 might be connected to its own set of signal lines of signal lines 368 to allow selective activation (i.e., activation of one or more of its transistors 360/460) or deactivation (i.e., deactivation of all of its transistors 360/460), each activated pull-down termination device 358 might receive the same set of control signals on its corresponding set of signal lines (e.g., signal lines 478).

The transistors 460 may have different channel widths with substantially the same channel length, thus providing different resistance values for the transistors 460. As an example, the transistor $460_1$ may have a channel width of two times the channel width of transistor $460_0$, the transistor $460_2$ may have a channel width of four times the channel width of transistor $460_0$, the transistor $460_3$ may have a channel width of eight times the channel width of transistor $460_0$, and the transistor $460_4$ may have a channel width of eight times the channel width of transistor $460_0$. Typical resistance values of resistors $462_0$ and $462_1$ might be 140 Ohms and 260 Ohms, respectively. In such a configuration, a variety of resistance values can be generated for the pull-down termination device 458 by selectively activating various combinations of the transistors 460. Note that the configuration of switchable resistances depicted in FIG. 4B is just one example, and other configurations of switchable resistances can be used for a pull-down termination device used with embodiments described herein, which are not restricted to any particular combination of parallel and/or serially connected switchable resistances.

Figure 5:
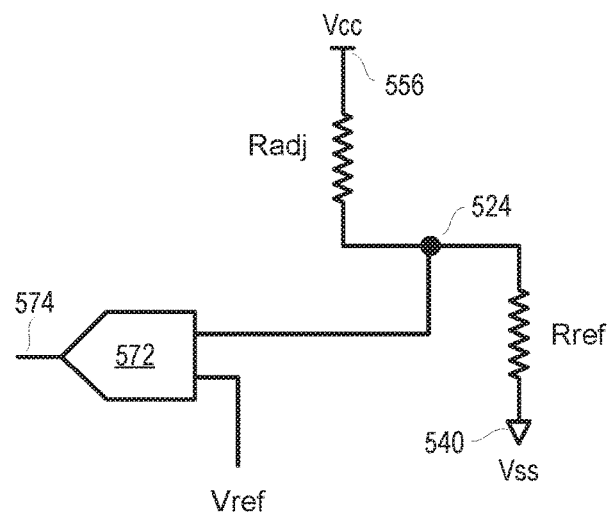
FIG. 5 is a simplified schematic for use in describing impedance adjustment for use with various embodiments.

FIG. 5 is a simplified schematic for use in describing impedance adjustment for use with various embodiments. FIG. 5 depicts an adjustable resistance Radj and a reference resistance Rref connected in series between a voltage node 556 and a voltage node 540, and may model the signal driver circuit 344 with regard to its calibration. For example, the reference resistance Rref may represent the ZQ resistor 322, the node 524 may represent the node 324, the voltage node 556 may represent the voltage node 356, and the voltage node 540 may represent the voltage node 340. The adjustable resistance Radj may represent the adjustable resistance of one or more of its pull-up termination devices 350. The calibration may include selectively activating one or more of the pull-up termination devices 350 of the pull-up unit driver seeking to match the reference resistance Rref, or the calibration may include adjusting a resistance of an individual pull-up termination device 350. While the pull-down termination devices 358 may be individually calibrated as well, with appropriate changes to the voltage of the voltage node 540 (e.g., coupled to receive Vcc instead of Vss), their settings are often just copied from the calibration settings of one of the pull-up termination devices 350.

In calibration, when the node 524 is connected to the voltage node 540 through the reference resistance Rref, and the node 524 is connected to the voltage node 556 through the adjustable resistance Radj, a voltage on the node 524 will be one-half of the sum of the voltage levels of the voltage nodes 556 and 540 when the adjustable resistance Radj is adjusted to be equal to the reference resistance Rref. For example, where the voltage node 556 is coupled to receive Vcc and the voltage node 540 is coupled to receive Vss, the node 524 would be at Vcc/2 if the adjustable resistance Radj is adjusted to be equal to the reference resistance Rref.

By connecting the node 524 to one input of a voltage comparator 572 and connecting the other input of the voltage comparator 572 to receive a reference voltage Vref, a signal can be provided on output 574 indicative of whether the voltage level on node 524 is less than or greater than the reference voltage Vref. For example, the signal on output 574 may have a logic high level when the voltage level of node 524 is less than the reference voltage Vref, and a logic low level when the voltage level of node 524 is less than the reference voltage Vref. As such, by setting the reference voltage Vref to Vcc/2, and incrementally adjusting the resistance Radj from a low value (e.g., its lowest adjustable value) to a high value (e.g., its highest adjustable value), the resistance Radj might be deemed to match the reference resistance Rref when the signal at the output 574 transitions from the logic low level to the logic high level. Alternately, the adjustable resistance Radj could be decrementally adjusted from a high value (e.g., its highest adjustable value) to a low value (e.g., its lowest adjustable value), and the resistance Radj might be deemed to match the reference resistance Rref when the signal at the output 574 transitions from the logic high level to the logic low level. In either case, the settings used for either the configuration before or after the signal transition might be deemed to provide a match to the reference resistance Rref.

For the calibration of a pull-up termination device 350 having a configuration of the pull-up termination device 450, the transistors 352 of all other pull-up termination devices 350 might be deactivated, and the transistors 360 of all pull-down termination devices 358 might be deactivated. The reference resistance Rref may again represent the ZQ resistor 322, the node 524 may again represent the node 324, the voltage node 556 may again represent the voltage node 356, and the voltage node 540 may again represent the voltage node 340. The adjustable resistance Radj may represent the adjustable resistance of the pull-up termination device 450 through its configuration of switchable resistances. The calibration may include selectively activating one or more of the transistors 452 seeking to match the reference resistance Rref similar to that described above.

Once a calibration of a pull-up termination device 350 is complete, the settings (i.e., calibration settings) deemed to provide a match to the reference resistance Rref might be used for each termination device of the signal driver circuit 344. Consider the example where the pull-up termination devices 350 each have the configuration of the pull-up termination device 450, and the pull-down termination devices 358 each have the configuration of the pull-down termination device 458. If the configuration settings of the pull-up termination device 450 deemed to match the reference resistance Rref included activation of transistors $452_4$, $452_2$ and $452_1$ (such as by applying a control signal having a logic low level to the corresponding signal lines $476_4$, $476_2$ and $476_1$), and deactivation of transistors $452_3$ and $452_0$ (such as by applying a control signal having a logic high level to the corresponding signal lines $476_3$ and $476_0$), each pull-up termination device 350 having the configuration of pull-up termination device 450 might have its transistors $452_4$, $452_2$ and $452_1$ activated, and its transistors $452_3$ and $452_0$ deactivated through similar application of control signals to their corresponding signal lines 476. Similarly, each pull-down termination device 358 having the configuration of pull-down termination device 458 might have its transistors $460_4$, $460_2$ and $460_1$ activated (such as by applying a control signal having a logic high level to the corresponding signal lines $478_4$, $478_2$ and $478_1$), and its transistors $460_3$ and $460_0$ deactivated (such as by applying a control signal having a logic low level to the corresponding signal line $478_3$ and $478_0$).

When calibrated in this manner, a unit driver might be capable of a termination or driver strength having a resistance values of Rref/N, where Rref is the reference resistance used for calibration, and N is the number of activated termination devices (e.g., like configured termination devices). During calibration, a boundary condition might be reached where no combination of switched resistances of a termination device are deemed a match to the reference resistance Rref. Thus, at a highest adjustable resistance, the resistance value of the termination device might be less than the reference resistance Rref, or at a lowest adjustable resistance, the resistance value of the termination device might be less than the reference resistance Rref.

For example, with reference to FIG. 4A, a lowest adjustable resistance for pull-up termination device 450 might correspond to a set of control signals to activate all of the transistors 452, while a highest adjustable resistance for pull-up termination device 450 might correspond to a set of control signals to activate only the transistor $452_4$. Thus, during a calibration, it might be determined that with all transistors 452 activated, the resistance value of the pull-up termination device 450 is still greater than the reference resistance Rref, or it might be determined that with only transistor $452_4$ activated, the resistance value of the pull-up termination device 450 is still less than the reference resistance Rref. A determination that such a boundary condition exists might be in response to the signal on the output 574 of the voltage comparator 572 failing to transition when adjusting the adjustable resistance Radj through the possible adjustable resistance values for a particular configuration and values of switchable resistances of the termination device. Traditionally, a calibration of a termination device that reached such a boundary condition might be deemed to fail, and thus the integrated circuit device (e.g., a memory device) might be deemed unusable.

Although termination devices have been calibrated against a particular resistance value for the reference resistance Rref corresponding to some specification (e.g., industry standard or internal standard), in practice, electronic devices are often permitted to vary from this specification. i.e., plus or minus some particular tolerance. As such, even though no combination of switchable resistances of a termination device might be found to satisfy a condition where the adjustable resistance Radj is deemed to match the reference resistance Rref, a termination device may still be usable if it is within its tolerance for resistance value. Various embodiments facilitate determining whether a termination device does fall within some tolerance of the desired reference resistance Rref.

Referring again to FIG. 5, if the reference voltage Vref applied to one input of the voltage comparator 572 is changed to a voltage level that is different than half-way between the voltage level of the voltage node 556 and the voltage level of the voltage node 540, e.g., greater than or less than Vcc/2 in the specific example, adjustable resistances Radj will have values less than or greater than, respectively, the reference resistance Rref when the voltage at the node 524 is deemed to match the reference voltage Vref. For example, where the voltage node 556 receives Vcc and the voltage node 540 receives Vss, and where a desired resistance value for adjustable resistance Radj is Rref*(1+x), where x is some positive or negative value, the reference voltage Vref could be set to have a value according to Equation 1:

$$Vcc/(2+x) \tag{1}$$

More generally, where a desired resistance value for adjustable resistance Radj is Rref*(1+x), where x is some positive or negative value, the reference voltage Vref could be set to have a value according to Equation 2:

$$\{Vhigh+Vlow*(1+x)\}/(2+x) \tag{2}$$

where Vhigh is the voltage level of the voltage node 556; and where Vlow is the voltage level of the voltage node 540.

Thus, where x is positive, resistance values greater than the reference resistance Rref can be determined, and where x is negative, resistance values less than the reference resistance Rref can be determined, using the same reference resistance Rref. Thus, for a particular resistance value (e.g., desired resistance value) for a termination device, an appropriate value for the reference voltage Vref can be determined from the foregoing equations.

Figure 6A:
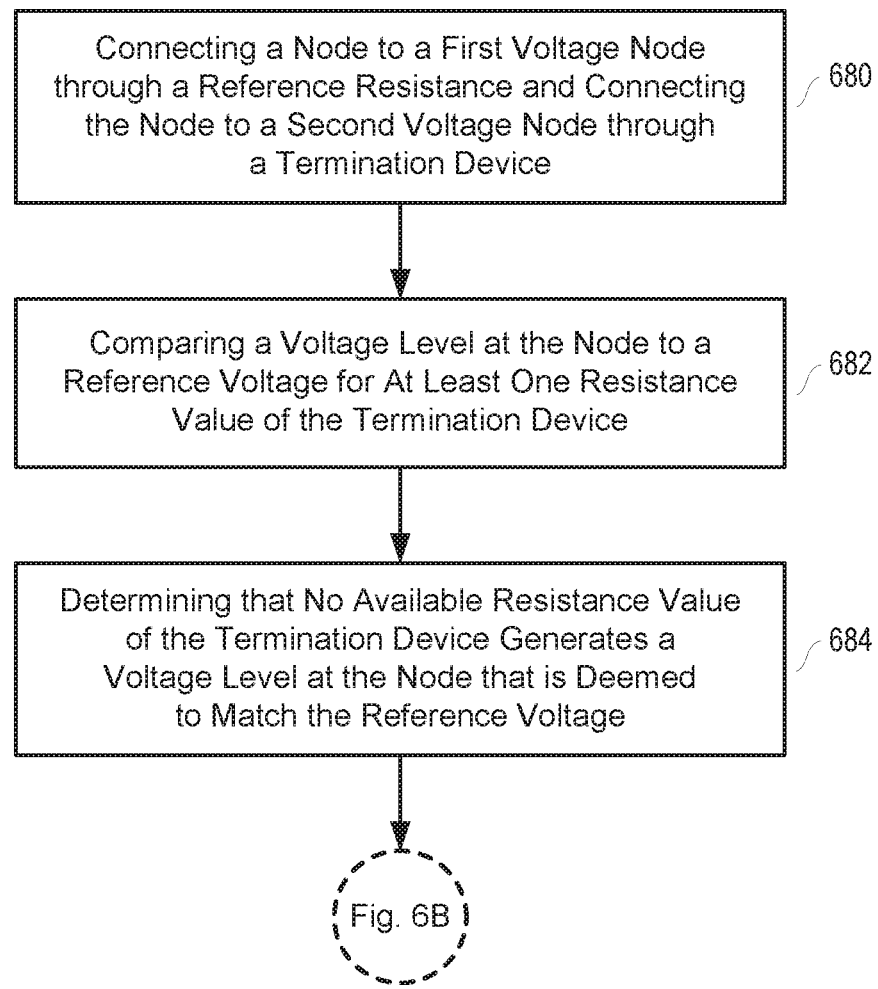
FIGS. 6A-6B are a flowchart of a method of operating an integrated circuit device according to an embodiment.
Figure 6B:
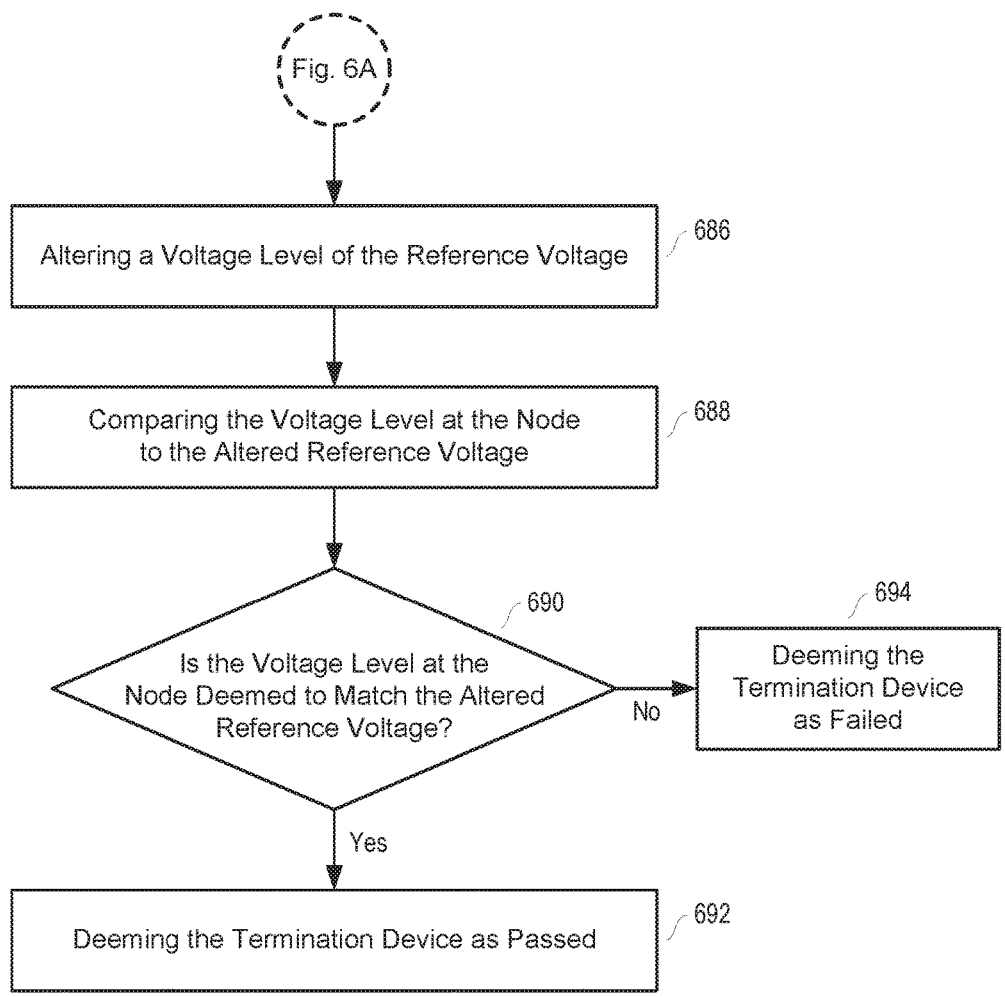

FIGS. 6A-6B are a flowchart of a method of operating an integrated circuit device. At 680, a node is connected to a first voltage node through a reference resistance and to a second voltage node through a termination device of a signal driver circuit. For example, the node 324 of the signal driver circuit 344 could be connected to the voltage node 340 (e.g., the first voltage node) through a reference resistance 322, and to the voltage node 356 (e.g., the second voltage node) through one of the pull-up termination devices 350. The selected pull-up termination device 350 might have one or more switchable resistances as discussed with reference to FIGS. 3 and 4A.

At 682, a voltage level at the node is compared to a reference voltage for at least one resistance value of the termination device. For example, the termination device may be calibrated as discussed with reference to FIG. 5, comparing the voltage level at node 524 with the reference voltage Vref at each adjustable resistance value of the particular configuration of switchable resistances for that termination device. At 684, it is determined that no available resistance value (e.g., an only resistance value or an adjustable resistance value) of the termination device generates a voltage level at the node that is deemed to match the reference voltage, e.g., a boundary condition is met where the termination device may be unable to provide a resistance value, at a highest or lowest available (e.g., adjustable or only) resistance value of the termination device, to generate a voltage level at the node 524 that is deemed to match the reference voltage Vref.

Note that it may be determined that no resistance value of the termination device generates a voltage at the node that is deemed to match the reference voltage after the first comparison, even where the termination device has an adjustable resistance value. For example, if the termination device receives control signals to place it in its lowest adjustable resistance value for the first comparison, and the comparison of the voltage level at the node to the reference voltage indicates that the voltage level at the node is less than the reference voltage, no further adjustments would be available as each remaining adjustable resistance value would further lower the voltage level at the node. Similarly, if the termination device receives control signals to place it in its highest adjustable resistance value for the first comparison, and the comparison of the voltage level at the node to the reference voltage indicates that the voltage level at the node is greater than the reference voltage, no further adjustments would be available as each remaining adjustable resistance value would further increase the voltage level at the node.

At 686, the reference voltage Vref is altered. For example, if the tolerance for the resistance value is plus or minus 15% from the reference resistance Rref (i.e., x equals plus or minus 0.15, respectively, e.g., in Equation 2), Vref could be set according to the relationship discussed above. Where the termination device has reached a highest adjustable resistance value without reaching a resistance value sufficient (e.g., high enough) to deem a match between the voltage level at the node and the reference voltage, the reference voltage may be reduced (i.e., x=0.15 in the foregoing example, e.g., in Equation 2) to obtain the adjusted reference voltage. Where the termination device has reached a lowest adjustable resistance value without reaching a resistance value sufficient (e.g., low enough) to deem a match between the voltage level at the node and the reference voltage, the reference value may be increased (i.e., x=−0.15 in the foregoing example, e.g., in Equation 2) to obtain the adjusted reference voltage.

Note that the tolerances above and below the reference resistance Rref need not be equal. Consider the example where the tolerance for the resistance value of the termination device is some value between Rref*(1+Tol$_1$) and Rref* (1−Tol$_2$). In this example, when a boundary condition is reached during calibration of a termination device, x=Tol$_1$ if the termination device has reached its lowest adjustable resistance value without reaching a resistance value sufficient (e.g., low enough) to deem a match between the voltage level at the node and the reference voltage, and x=−Tol$_2$ if the termination device has reached its highest adjustable resistance value without reaching a resistance value sufficient (e.g., high enough) to deem a match between the voltage level at the node and the reference voltage.

At 688, the voltage at the node is compared to the altered reference voltage. If the voltage level at the node is deemed to match the altered reference voltage at 690, the method continues to 692, where the termination device is deemed as passed, i.e., it is deemed to operate within the defined tolerance (e.g., within plus or minus 15% in the foregoing example). As discussed with reference to FIG. 5, the voltage level at the node might be deemed to match the reference voltage when an output signal of a voltage comparator transitions from one logic level to another. If the voltage level at the node is deemed to not match the altered reference voltage at 690, the method continues to 694, where the termination device is deemed as failed, i.e., it is deemed to operate outside the defined tolerance (e.g., outside plus or minus 15% in the foregoing example).

If the termination device is deemed as passed at 692, the current settings of the termination device (e.g., the settings of the reached boundary condition) might be stored in response to deeming the termination device as passed. As noted above, the stored settings are generally used for other termination devices. However, the other termination devices might be individually calibrated using the same or different reference voltage.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating an integrated circuit device, comprising:
generating a voltage level at a particular node of the integrated circuit device between a termination device of a signal driver circuit of the integrated circuit device and a reference resistance in response to a first voltage level applied to the termination device and a second voltage level applied to the reference resistance;
in response to generating the voltage level at the particular node, determining whether a plurality of available resistance values of the termination device satisfy a criterion selected from a group consisting of each available resistance value of the plurality of available resistance values is less than a resistance value of the reference resistance, and each available resistance value of the plurality of available resistance values is greater than the resistance value of the reference resistance;
if the plurality of available resistance values of the termination device are determined to satisfy the criterion, determining whether a voltage level generated at the particular node in response to the first voltage level applied to the termination device and the second voltage level applied to the reference resistance while the termination device has a particular available resistance value of the plurality of available resistance values is between a voltage level of a first reference voltage and a voltage level of a second reference voltage;
wherein the voltage level of the first reference voltage is determined in response to the first voltage level and the second voltage level; and
wherein the voltage level of the second reference voltage is determined in response to the first voltage level, the second voltage level, and a defined tolerance for a desired resistance value of the termination device.

2. The method of claim 1, wherein the particular available resistance value is a highest available resistance value of the plurality of available resistance values when each available resistance value of the plurality of available resistance values is determined to be less than the reference resistance, and wherein the particular available resistance value is a lowest available resistance value of the plurality of available resistance values when each available resistance value of the plurality of available resistance values is determined to be greater than the reference resistance.

3. The method of claim 2, wherein the voltage level of the second reference voltage is closer to the first voltage level than the second voltage level when each available resistance value of the plurality of available resistance values is determined to be less than the reference resistance, and wherein the voltage level of the second reference voltage is closer to the second voltage level than the first voltage level when each available resistance value of the plurality of available resistance values is determined to be greater than the reference resistance.

4. The method of claim 1, further comprising determining the voltage level of the first reference voltage to be halfway between the first voltage level and the second voltage level.

5. The method of claim 4, further comprising determining the voltage level of the second reference voltage according to an equation $\{Vhigh+Vlow*(1+x)\}/(2+x)$, wherein Vhigh is a highest voltage level selected from a group consisting of the first voltage level and the second voltage level, Vlow is a lowest voltage level selected from the group consisting of the first voltage level and the second voltage level, and x is a positive or negative value indicative of the defined tolerance for the desired resistance value of the termination device expressed as a percentage of the resistance value of the reference resistance.

6. The method of claim 1, wherein generating the voltage level at the particular node comprises generating a respective voltage level at the particular node for a subset of available resistance values of the plurality of available resistance values.

7. The method of claim 6, wherein generating the respective voltage level at the particular node for the subset of available resistance values of the plurality of available resistance values comprises generating the respective voltage level at the particular node for each available resistance value of the plurality of available resistance values.

8. The method of claim 6, wherein determining that the plurality of available resistance values of the termination device satisfy the criterion that each available resistance value of the plurality of available resistance values is less than the resistance value of the reference resistance comprises determining that the generated respective voltage level at the particular node for each available resistance value of the subset of available resistance values is between the first voltage level and the voltage level of the first reference voltage.

9. The method of claim 8, wherein determining that the plurality of available resistance values of the termination device satisfy the criterion that each available resistance value of the plurality of available resistance values is greater than the resistance value of the reference resistance comprises determining that the generated respective voltage level at the particular node for each available resistance value of the subset of available resistance values is between the second voltage level and the voltage level of the first reference voltage.

10. The method of claim 1, wherein generating the voltage level at the particular node comprises generating the voltage level for only the particular resistance value of the plurality of available resistance values before determining whether the plurality of available resistance values of the termination device satisfy the criterion.

11. The method of claim 6, wherein determining that the plurality of available resistance values of the termination device satisfy the criterion that each available resistance value of the plurality of available resistance values is less than the resistance value of the reference resistance comprises determining that the generated voltage level at the particular node for the particular resistance value of the plurality of available resistance values is between the first voltage level and the voltage level of the first reference voltage when the particular resistance value is a highest resistance value of the plurality of resistance values, and wherein determining that the plurality of available resistance values of the termination device satisfy the criterion that each available resistance value of the plurality of available resistance values is greater than the resistance value of the reference resistance comprises determining that the generated voltage level at the particular node for the particular resistance value of the plurality of available resistance values is between the first voltage level and the voltage level of the first reference voltage when the particular resistance value is a lowest resistance value of the plurality of resistance values.

12. A method of operating an integrated circuit device, comprising:

for at least one available resistance value of a plurality of available resistance values of a termination device of a signal driver circuit of the integrated circuit device, generating a respective voltage level at a particular node of the integrated circuit device between the termination device and a reference resistance in response to a first voltage level applied to the termination device and a second voltage level applied to the reference resistance;

for each at least one available resistance value of the plurality of available resistance values of the termination device, comparing its respective voltage level generated at the particular node to a voltage level of a first reference voltage;

determining that the plurality of available resistance values of the termination device satisfy a criterion that either no available resistance value of the plurality of available resistance values of the termination device would generate its respective voltage level at the particular node to be less than a voltage level of a first reference voltage, or no available resistance value of the plurality of available resistance values of the termination device would generate its respective voltage level at the particular node to be greater than the voltage level of the first reference voltage;

when it is determined that the plurality of available resistance values of the termination device satisfy the criterion, determining whether a particular available resistance value of the plurality of available resistance values generates its respective voltage level at the particular node in response to the first voltage level applied to the termination device and the second voltage level applied to the reference resistance to be between a voltage level of the first reference voltage and a voltage level of a second reference voltage;

wherein the voltage level of the first reference voltage is between the first voltage level and the second voltage level;

wherein the voltage level of the second reference voltage is less than the voltage level of the first reference voltage when no available resistance value of the plurality of available resistance values of the termination device would generate its respective voltage level at the particular node to be greater than the voltage level of the first reference voltage; and wherein the voltage level of the second reference voltage is greater than the voltage level of the first reference voltage when no available resistance value of the plurality of available resistance values of the termination device would generate its respective voltage level at the particular node to be less than the voltage level of the first reference voltage.

13. A method of operating an integrated circuit device, comprising:

generating a voltage level at a particular node of the integrated circuit device between a termination device of a signal driver circuit of the integrated circuit device and a reference resistance in response to a first voltage level applied to the termination device and a second voltage level applied to the reference resistance, wherein the first voltage level is higher than the second voltage level;

in response to generating the voltage level at the particular node, determining whether a plurality of available resistance values of the termination device satisfy a criterion selected from a group consisting of each available resistance value of the plurality of available resistance values is less than a resistance value of the reference resistance, and each available resistance value of the plurality of available resistance values is greater than the resistance value of the reference resistance;

if the plurality of available resistance values of the termination device are determined to satisfy the criterion, determining whether a voltage level generated at the particular node in response to the first voltage level applied to the termination device and the second voltage level applied to the reference resistance while the termination device has a particular available resistance value of the plurality of available resistance values is between a voltage level of a first reference voltage and a voltage level of a second reference voltage;

wherein the voltage level of the first reference voltage is halfway between the first voltage level and the second voltage level;

wherein the voltage level of the second reference voltage is determined in response to the first voltage level, the second voltage level, and a defined tolerance for a desired resistance value of the termination device;

wherein the particular available resistance value is a highest available resistance value of the plurality of available resistance values when each available resistance value of the plurality of available resistance values is determined to be less than the reference resistance; and wherein the particular available resistance value is a lowest available resistance value of the plurality of available resistance values when each available resistance value of the plurality of available resistance values is determined to be greater than the reference resistance.

14. The method of claim 13, wherein the voltage level of the second reference voltage is higher than the voltage level of the first reference voltage when each available resistance value of the plurality of available resistance values is determined to be less than the reference resistance, and wherein the voltage level of the second reference voltage is lower than the voltage level of the first reference voltage when each available resistance value of the plurality of available resistance values is determined to be greater than the reference resistance.

15. The method of claim 14, further comprising determining the voltage level of the second reference voltage according to an equation $\{Vhigh+Vlow*(1+x)\}/(2+x)$, wherein Vhigh is the first voltage level, Vlow is the second voltage level, x is negative value indicative of the defined tolerance for the desired resistance value of the termination device expressed as a percentage of the resistance value of the reference resistance when each available resistance value of the plurality of available resistance values is determined to be less than the reference resistance, and x is positive value indicative of the defined tolerance for the desired resistance value of the termination device expressed as a percentage of the resistance value of the reference resistance when each available resistance value of the plurality of available resistance values is determined to be greater than the reference resistance.

16. The method of claim 13, wherein generating the respective voltage level at the particular node for the subset of available resistance values of the plurality of available resistance values comprises generating the respective voltage level at the particular node for each available resistance value of the plurality of available resistance values.

17. The method of claim 16, wherein determining that the plurality of available resistance values of the termination device satisfy the criterion that each available resistance value of the plurality of available resistance values is less than the resistance value of the reference resistance comprises determining that the generated respective voltage level at the particular node for each available resistance value of the subset of available resistance values is higher than the voltage level of the first reference voltage.

18. The method of claim 16, wherein determining that the plurality of available resistance values of the termination device satisfy the criterion that each available resistance value of the plurality of available resistance values is greater than the resistance value of the reference resistance comprises determining that the generated respective voltage level at the particular node for each available resistance value of the subset of available resistance values is lower than the voltage level of the first reference voltage.

19. The method of claim 13, wherein generating the voltage level at the particular node comprises generating the voltage level for only the particular resistance value of the plurality of available resistance values before determining whether the plurality of available resistance values of the termination device satisfy the criterion.

20. The method of claim 19, wherein determining that the plurality of available resistance values of the termination device satisfy the criterion that each available resistance value of the plurality of available resistance values is less than the resistance value of the reference resistance comprises determining that the generated voltage level at the particular node for the particular resistance value of the plurality of available resistance values is higher than the voltage level of the first reference voltage when the particular resistance value is a highest resistance value of the plurality of resistance values, and wherein determining that the plurality of available resistance values of the termination device satisfy the criterion that each available resistance value of the plurality of available resistance values is greater than the resistance value of the reference resistance comprises determining that the generated voltage level at the particular node for the particular resistance value of the plurality of available resistance values is lower than the voltage level of the first reference voltage when the particular resistance value is a lowest resistance value of the plurality of resistance values.

* * * * *